United States Patent [19]

Tanigawa et al.

[11] Patent Number: 5,328,871
[45] Date of Patent: Jul. 12, 1994

[54] MANUFACTURING PROCESS FOR SEMICONDUCTOR DEVICE

[75] Inventors: Makoto Tanigawa, Kitakatsuragi; Shingo Okazaki, Nara, both of Japan

[73] Assignee: Sharp Kabushiki Kaisha, Osaka, Japan

[21] Appl. No.: 833,907

[22] Filed: Feb. 11, 1992

[30] Foreign Application Priority Data

Feb. 18, 1991 [JP] Japan .................................. 3-023509

[51] Int. Cl.⁵ .......................................... H01L 21/31
[52] U.S. Cl. ...................................... 437/231; 437/238
[58] Field of Search ................................ 437/231, 238

[56] References Cited

U.S. PATENT DOCUMENTS

| | | | |
|---|---|---|---|
| 4,683,024 | 7/1987 | Miller et al. | 156/646 |
| 4,732,785 | 3/1988 | Brewer | 437/231 |
| 4,826,709 | 5/1989 | Ryan et al. | 437/231 |
| 4,885,262 | 12/1989 | Ting et al. | 437/228 |
| 4,906,592 | 3/1990 | Merenda et al. | 437/190 |
| 5,003,062 | 3/1991 | Yen | 437/235 |
| 5,106,787 | 4/1992 | Yen | 437/231 |

FOREIGN PATENT DOCUMENTS 59-121940  7/1984  Japan ................................ 437/231

*Primary Examiner*—Robert Kunemund
*Assistant Examiner*—Ourmazd S. Ojan
*Attorney, Agent, or Firm*—Nixon & Vanderhye

[57] ABSTRACT

A manufacturing process for a semiconductor device comprising the following steps: to spin-coat by Spin-on method a solution for forming a SOG film on a wafer having a device formed on the surface to form a coating of the SOG film forming solute thereon; to treat by a liquid which is able to dissolve the solute for forming SOG film at least a part of the wafer which is held by claws of a dry etching system at a later stage in the series of processes, thereby removing a coating of the SOG film forming solute at that part; and to then bake the wafer to complete a SOG film.

7 Claims, 2 Drawing Sheets

CUP 1        TRANSMISSION OF WAFER        CUP 2

MANUFACTURING PROCESS FOR SEMICONDUCTOR DEVICE

BACKGROUND OF THE INVENTION

1. Field of the Invention

The invention relates to a manufacturing process for a semiconductor device, and more particularly to a forming process for a SOG film.

2. Description of the Related Art

A conventional manufacturing process for a semiconductor device is carried out as follows. As shown in FIG. 4, a solution for forming a SOG film is first spin-coated, by Spin-On method, on a wafer having a device formed on the surface to form a coating of the SOG film forming solute thereon. The wafer is baked (hard baking) to complete a SOG film which is then coated thereon with a resist solution and partially removed by photo-lithographic method at a part of the device that is held by claws of a dry etching system at a later stage in the series of processes. In detail, removal of SOG film at the above part is made for preventing generation of dust in the subsequent dry etching process and is continued until SOG film is completely taken off of that part so as to avoid occurrence of generation of dust from that part of the SOG film which is broken by the wafer holding claws of the dry etching system.

The above conventional manufacturing process for a semiconductor device has a problem that the photolithography process for removing SOG film at the part of device to be held by the claws of dry etching system is complicated.

The present invention has been designed to overcome the above problem. An object of the present invention is to provide a manufacturing process for a semiconductor device wherein a SOG film of a pattern that avoids contact with the claws of dry etching system is provided by a simple process, so that a semiconductor device is prepared through processes having less generation of dust.

SUMMARY OF THE INVENTION

According to the present invention, there is provided a manufacturing process for a semiconductor device comprising the following steps: to spin-coat by Spin-on method a solution for forming a SOG film on a wafer having a device formed on the surface to form a coating of the SOG film forming solute thereon; to treat by a liquid which is able to dissolve the solute for forming SOG film at least a part of the wafer which is held by claws of a dry etching system at a later stage in the series of processes, thereby removing a coating of the SOG film forming solute at that part; and to then bake the wafer to complete a SOG film.

DETAILED DESCRIPTION OF THE PREFERRED EMBODIMENTS

Figure 1:
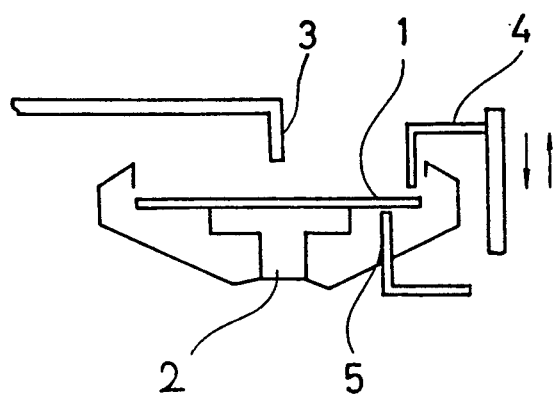
FIG. 1 is a schematic diagram showing a manufacturing process for a semiconductor device prepared by an example of the present invention.

In the manufacturing process for a semiconductor device according to the present invention, a solution for forming SOG film is first spin-coated, by Spin-on method, on a wafer having a device formed on the surface to form a coating of a solute for forming SOG film.

The SOG film forming solution is to be applied on a wafer by Spin-on method and may use a solution containing generally of 4 to 20 weight % of solute for forming SOG film. Examples of solvents used for such solution are ethanol, propylene glycol monopropyl ether or the like. The SOG film forming solute which when baked forms a SOG film (glass insulating film) may use an inorganic silanol compound, such as $Si(OH)_4$ or the like, or a silanolic compound containing the inorganic silanol compound as a main component and an organic silanol compound, such as about 5 to 10 weight % of $(CH_3)_2Si(OH)_2$ or the like. Thickness of coating of the SOG film forming solute is controlled to allow the resultant SOG film (after baking) to be of 0.1 to 0.6 μm in thickness.

In the present invention, at least a part of the wafer which is held by claws of a dry etching system at a later stage in the series of processes is treated by a liquid which is able to dissolve the SOG film forming solute, thereby removing a coating of the SOG film forming solute at that part.

That part of the wafer is on an outer peripheral end thereof and may generally be set on the surface of wafer to an extent of 2 to 4 mm or less from the outer peripheral edge.

Examples of the liquids for dissolving the SOG film forming solute are organic solvents (e.g., ethanol, isopropyl alcohol, butyl cellosolve acetate, propylene glycol monopropyl ether, acetone, ethyl cellosolve acetate, ethyl ethoxypropionate, cyclohexanone, N-methyl-2-pyrrolidone or the like), or an aqueous solution containing hydrofluoric acid or ammonium fluoride. The aqueous solution may be a buffered solution of hydrofluoric acid, or a mixture of ammonium fluoride and acetic acid.

Preferably, the organic solvent that is easy in handling is used. When the coating of SOG film forming solute at that part of the wafer is treated by the liquid for dissolving the SOG film forming solute, the remainder of that coating is swollen and projected at its end with the liquid. When the wafer is baked to complete SOG film and the swollen end of the coating is larger in thickness than a predetermined value, the swollen end causes cracks at an end of the resultant SOG film. It is preferable that thickness of the swollen end of SOG film forming solute (after baking) is 1.5 μm or less when the solute uses silanolic composition containing an organic silanol compound (organic SOG film forming solute), and 0.8 μm or less when the solute using silanolic composition not containing an organic silanol composition (inorganic SOG film forming solute).

Generation of the swollen portion of the coating can be mitigated by optimizing parameters, such as time for discharging the treatment liquid, time for the treatment, the speed of rotation of wafer, diameter of nozzle for discharging the liquid, set angles of the nozzle, and kinds of the liquid to dissolve the SOG film forming solute. The kinds of the liquid to dissolve the solute among the above factors have been found to have a largest influence upon generation of the swollen portion. Cyclohexanone among the liquids to dissolve the SOG film forming solute is most preferable since it generates a smaller swollen portion of the coating.

In the processes of the present invention, the wafer is then baked to complete SOG film. The baking is carried out generally at 200° to 450° C. to cause polymerization as represented by the following formula, so that a silanolic composition is changed to polysiloxane or polysilicate ($nSiO_2$) to form a SOG film.

$nSi(OH)_4 + 5$ to 10% of $(CH_3)_2Si(OH)_2 \rightarrow nSiO_2$ polysiloxane $nSi(OH)_4 \rightarrow nSiO_2$ polysilicate $-H_2O$ The resultant SOG film is then used to form a device by use of a dry etching system to prepare a semiconductor device.

In the present invention, the liquid which is able to dissolve the SOG film forming solute is adapted to dissolve the formed coating of SOG film forming solute on the wafer at least at the part which is held by claws of the dry etching system at a later stage of processing.

EXAMPLES

Next, examples of the present invention will be detailed by reference to the accompanied drawings.

EXAMPLE 1

As shown in FIG. 1, a wafer 1 having a device formed thereon was set on a chuck 2. A SOG film forming solution (a solution of an organic SOG film forming solute containing 15 weight% of solid component of $[Si(OH)_4 + (CH_3)_2Si(OH)_2]$) was dropped from a dropping nozzle (rotary movable nozzle) to be applied (spin-coated) on the wafer, thereby forming a coating of polysiloxane gel (in turn, of the SOG film forming solute).

IPA (isopropyl alcohol) was then jetted from a nozzle 5 for back side rinsing to clean an end of rear surface of the wafer, and cyclohexanone was discharged from a nozzle 4 located above the top surface of the wafer as illustrated in FIG. 1 (for top edge rinsing) for treating a coating of SOG film forming solute to treat a coating of polysiloxane gel. The extent of the treatment was at a part of the wafer extending 2 to 4 mm from its edge, a diameter of the edge rinsing nozzle 4 0.39 mm, an interval between the edge rinsing nozzle 4 and the wafer 1 1.5 to 2 mm, and feeding of cyclohexanone was carried out by $N_2$ pressure system (0.15 to 0.30 kg/cm$^2$).

The treated wafer was baked at about 450° C. to change the coating of polysiloxane gel to a SOG film.

The resultant SOG film was 0.57 μm in thickness at the end and 0.56 μm in thickness at a flat part other than the end portion. Swelling of the end part of the SOG film was quite small and no cracks were found at the end part.

The wafer was then held by claws of dry etching system to be subjected to dry etching process.

Increase of the amount of dust 0.3 μm or more in size was measured. 39 units of dust a wafer were found as shown in Table 1. Generation of dust is low in comparison with the comparative examples described later.

TABLE 1

| | SOG film forming solute in spin-coated solution | | Increase of dust 0.3 μm or more in size (amount/wafer) |
|---|---|---|---|
| | inorganic | organic | |
| Example 3 | 0 | | 35 |
| 1 | | 0 | 39 |
| Comparative example 1 | 0 | | 183 |
| 2 | | 0 | 90 |

EXAMPLE 2

A coating of polysiloxane gel on the wafer was treated in the similar manner with Example 1 except use of any of nine kinds of liquid which is able to dissolve polysiloxane gel, such as ethanol, isopropyl alcohol, butyl cellosolve acetate, propylene glycol monopropyl ether, acetone, ethyl cellosolve acetate, ethyl ethoxypropionate solvent (1) and (2) or N-methyl-2-pyrrolidone in place of cyclohexanone. After the treatment, remainder of the coating of polysiloxane gel was baked to be changed to a SOG film. Thickness of the end part of the film was measured to obtain the result shown in Table 2. When using butyl cellosolve acetate, propylene glycol monopropyl ether, ethyl cellosolve acetate or N-methyl-2-pyrrolidone among the above liquids, the resultant SOG film conveniently had a smaller swelling end.

TABLE 2

| | SOG film forming solute in the provided coating | |
|---|---|---|
| Liquid dissolving SOG film forming solute | $Si(OH)_4$ | $Si(OH)_4$ & $(CH_3)_2Si(OH)_2$ |
| Ethanol | ~1.48 (μm) | 2.17 (μm) |
| Isopropyl alcohol | ~1.08 | ~1.88 |
| Butyl cellosolve acetate | ~0.44 | ~1.11 |
| Propylene glycol monopropyl ether | ~0.46 | ~0.91 |
| Acetone | ~0.92 | ~4.41 |
| Ethyl cellosolve acetate | ~0.75 | ~1.07 |
| Ethyl ethoxypropionate(1) | ~0.64 | ~1.02 |
| Ethyl ethoxypropionate(2) | ~0.61 | ~0.98 |
| Cyclohexanone(*) | ~0.38 | ~0.57 |
| N-methyl-2-pyrrolidone | — | ~0.67 |
| Thickness of SOG film at flat part | 0.13 | 0.56 |
| Critical film thickness for crack proof | 0.80 | 1.5 |

(*)Example 1

EXAMPLE 3

A coating of polysilicate gel was formed in the similar manner with Example 2 except using for the SOG film forming liquid a solution of inorganic solute for forming SOG film containing 4.8 weight % of $Si(OH)_4$ in place of a solution of organic solute for forming SOG film containing 15 weight % of $Si(OH)_4 + (CH_3)_2Si(OH)_4$. The wafer was treated by use of a liquid which is able to dissolve the polysilicate gel coating, followed by baking the wafer at about 450° C. to change the coating to a SOG film.

Table 2 shows thickness of the formed SOG film at its end portion. A wafer treated by use of cyclohexane was held by claws of the dry etching system to be subjected to dry etching.

Measurement result of an increase of the amount of dust of 0.3 μm or more in size exhibited 35 dust a wafer as shown in Table 1. Occurrence of generation of dust in this case is low in comparison with the comparative examples described hereunder.

EXAMPLE 4

Figure 2:
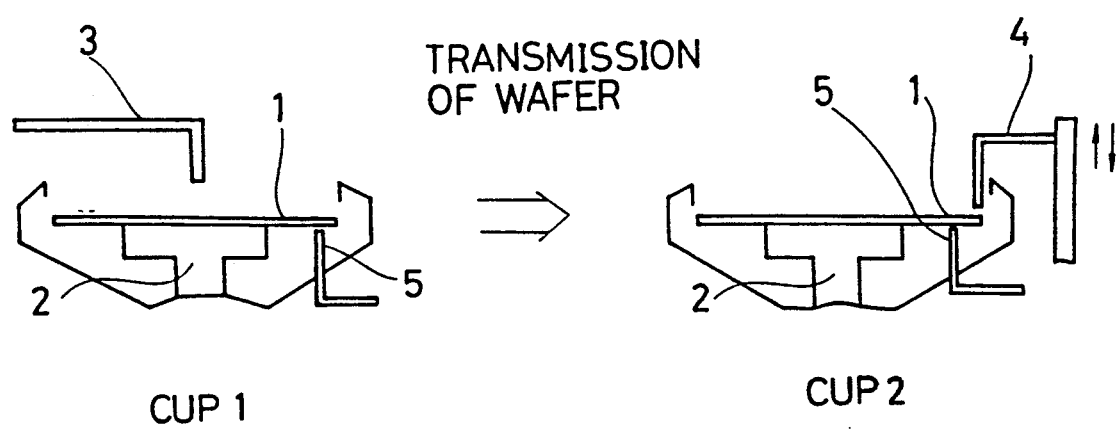
FIG. 2 is also a schematic diagram showing a manufacturing process for a semiconductor device prepared by another example of the present invention.
Figure 3:
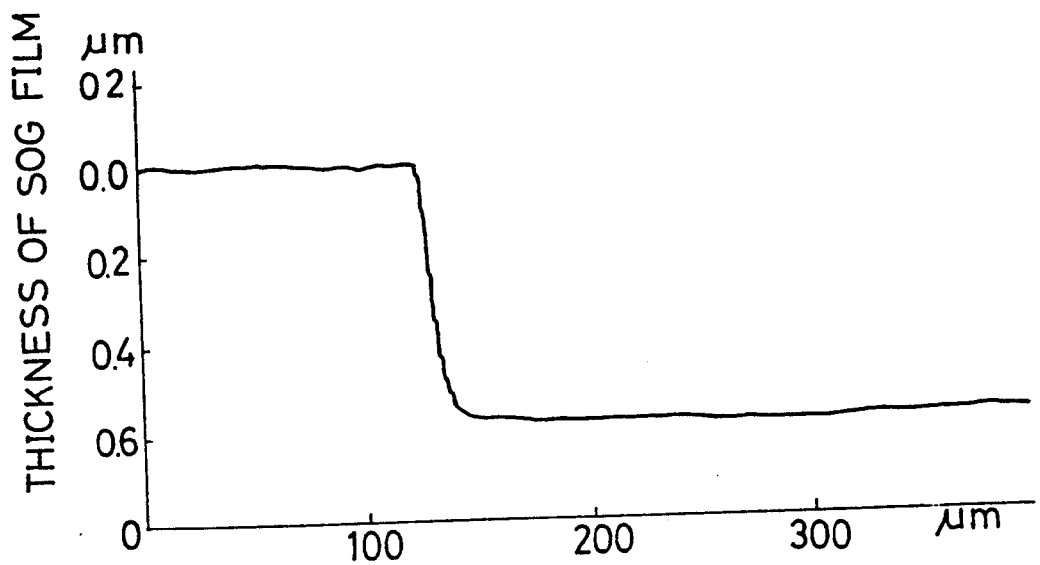
FIG. 3 is a graph showing measurement result of coating thickness of a coating for forming SOG film provided in a manufacturing process for a semiconductor device prepared by the example of the present invention.
Figure 4:
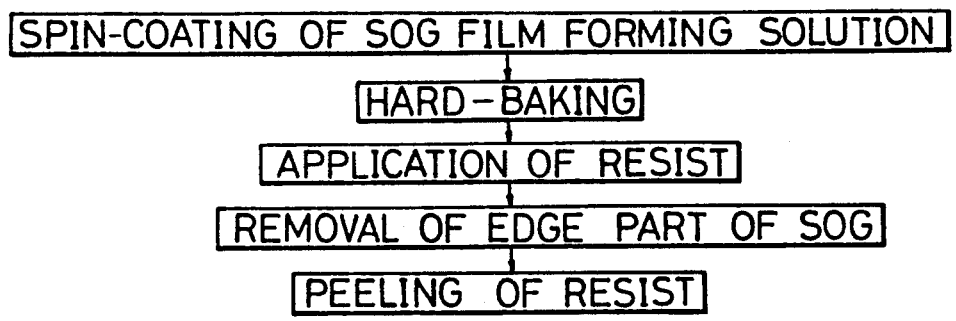
FIG. 4 is a flow chart showing a conventional manufacturing process for a semiconductor device.

A wafer 1 having a device formed thereon was placed on a chuck 2 of a cup 1 (for spin-coating) as shown in FIG. 2. A solution for forming SOG film (an inorganic solution containing 4.8 weight % of Si(OH)$_4$) was dropped through a rotary type of movable dropping nozzle 3 and coated on the wafer while the rear side of the wafer was washed by pure water jetted from a backside rinsing nozzle 5, thereby forming a coating of polysilicate gel.

The wafer was then transmitted to a cup 2 (for edge rinsing) to be subjected to spinning process by dropping buffered fluoric acid through an edge-rinsing nozzle 4 to cause the polysilicate gel coating on a predetermined part of the wafer to be treated while the rear surface of wafer was washed by IPA jetted from the backside rinsing nozzle 5.

Then, a semiconductor device was completed in the similar manner with Example 1.

COMPARATIVE EXAMPLE 1

A SOG film was prepared on a wafer in the similar manner with Example 1 except that treatment by use of liquid which is able to dissolve the coating of polysiloxane gel was not carried out. The wafer was subjected to dry etching to prepare a semiconductor device. Measurement result of increase of the amount of dust of 0.3 $\mu$m or more in size in the dry etching process showed such a higher value as 183 dust a wafer as seen in Table 1.

COMPARATIVE EXAMPLE 2

A semiconductor device was prepared in the similar manner with the comparative example 1 except use of an inorganic solution for the SOG film forming liquid in place of an organic solution. An increase of the amount of dust of 0.3 $\mu$m or more in size was high as 90 dust a wafer as seen in Table 1.

What we claim is:

1. A manufacturing process for a semiconductor device comprising the steps of: spin-coating by a Spin-on method a solution for forming a SOG film on a top surface of a wafer having a device formed on the surface to form a coating of the SOG film forming solute thereon, wherein the solute is an inorganic silanol compound, an organic silanol compound or a mixture thereof; treating with a liquid applied to the film on said top surface by an edge rinse means located above said top surface of the wafer which is able to dissolve the solute for forming the SOG film at at least a peripheral edge part of the wafer which part is held by claws of a dry etching system at a later stage of wafer processing, thereby removing a coating of the SOG film forming solute at said peripheral part; and then baking the wafer to complete a SOG film.

2. A manufacturing process or a semiconductor device as set forth in claim 1, wherein the SOG film forming solute is a mixture of an inorganic silanol compound and 5 to 10 weight % of an organic silanol compound.

3. A manufacturing process for a semiconductor device as set forth in claim 1, wherein the coating of the SOG film forming solute is removed corresponding to a par of the wafer extending 2 to 4 mm from an outer peripheral edge of the wafer.

4. A manufacturing process for a semiconductor device as set forth in claim 1, wherein the liquid is an organic solvent selected form the group consisting of butyl cellosolve acetate, prophylene glycol monopropyl ether, ethyl cellosolve acetate, ethyl ethoxypropionate, cyclohexanone and N-methyl-2-pyrrolidone.

5. A manufacturing process for a semiconductor device comprising the following steps: spin-coating by a Spin-on method a solution for forming a SOG film on a wafer having a device formed on the surface to form a coating of the SOG film forming solute thereon; treating by a liquid which is able to dissolve the solute for forming SOG film at at least a peripheral part o the wafer which part is held by claws of a dry etching system at a later stage of wafer processing, thereby removing a coating of the SOG film forming solute at said peripheral part; and then baking the wafer to complete a SOG film, wherein the liquid is an aqueous buffered solution containing hydrofluoric acid.

6. A manufacturing process for a semiconductor device comprising the following steps: spin-coating by a Spin-on method a solution for forming a SOG film on a wafer having a device formed on the surface to form a coating of the SOG film forming solute thereon; heating by a liquid which is able to dissolve the solute for forming SOG film at at least a peripheral part of the wafer which part is held by claws of a dry etching system at a layer stage of wafer processing, thereby removing a coating of the SOG film forming solute at said peripheral part; and then baking the wafer to complete a SOG film, wherein the lqiuid is an aqueous solution containing a mixture of ammonium fluoride and acetic acid.

7. A manufacturing process or a semiconductor device comprising the steps of: spin-coating by a Spin-on method a solution for forming a SOG film on a top surface of a wafer having a device formed on the surface to form a coating of the SOG film forming solute thereon, wherein the solute is an inorganic silanol compound, an organic silanol compound or a mixture thereof; treating with a liquid applied to the film on said top surface by edge rinse means located groove said top surface of the wafer which is able to dissolve the solute for forming the SOG film at at least a peripheral edge part of the wafer which part is held by claws of a dry etching system at a later stage of wafer processing, thereby removing a coating of the SOG film forming solute at said peripheral part; and then baking the wafer to complete a SOG film wherein the liquid is an organic solvent selected from the group consisting of cyclohexanone, propylene glycol monopropyl ether and ethyl ethoxypropionate.

* * * * *